US006197663B1

(12) United States Patent
Chandross et al.

(10) Patent No.: US 6,197,663 B1
(45) Date of Patent: Mar. 6, 2001

(54) PROCESS FOR FABRICATING INTEGRATED CIRCUIT DEVICES HAVING THIN FILM TRANSISTORS

(75) Inventors: Edwin Arthur Chandross, Murray Hill; Ananth Dodabalapur, Millington; Howard Edan Katz, Summit; Venkataram Reddy Raju, New Providence, all of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/456,210

(22) Filed: Dec. 7, 1999

(51) Int. Cl.$^7$ .................................................. H01L 21/30
(52) U.S. Cl. ............................ 438/455; 438/149; 438/99
(58) Field of Search ................................... 438/455, 149, 438/99

(56) References Cited

U.S. PATENT DOCUMENTS

| | | | |
|---|---|---|---|
| 3,909,332 | * 9/1975 | Yerman | 156/309 |
| 5,358,809 | * 10/1994 | Van Berkel | 430/6 |
| 5,410,183 | 4/1995 | Murai | 257/750 |
| 5,414,299 | 5/1995 | Wang et al. | 257/702 |
| 5,416,044 | * 5/1995 | Chino et al. | 437/129 |
| 5,596,208 | 1/1997 | Dodabalapur et al. | 257/66 |
| 5,625,199 | 4/1997 | Baumach et al. | 257/40 |
| 5,625,474 | * 4/1997 | Aomori et al. | 349/79 |
| 5,633,209 | 5/1997 | Leedy | 435/228 |
| 5,659,181 | 8/1997 | Bridenbaugh et al. | 257/40 |
| 5,671,173 | 9/1997 | Tomita | 365/63 |
| 5,689,136 | 11/1997 | Usami et al. | 257/679 |
| 5,727,310 | 3/1998 | Casson et al. | 29/830 |
| 5,915,167 | 6/1999 | Leedy | 438/108 |
| 5,998,804 | * 12/1999 | Suh et al. | 257/40 |
| 6,013,562 | * 1/2000 | Kemmer | 438/455 |

OTHER PUBLICATIONS

Rogers, J.A. et al., *Applied Physics Letters*, "Nonphotolithographic Fabrication of Organic Transistors With Micron Feature Sizes", vol. 72, No. 21, pp. 2716–2718, May 25, 1998.

Drury, C.J. et al., *Applied Physics Letters*, "Low–Cost All–Polymer Integrated Circuits", vol. 73, No. 1, pp. 108–110, Jul. 6, 1998.

Bao, Z. et al., *Chemistry of Materials*, "High Performance Plastic Transistors Fabricated by Printing Techniques", vol. 9, No. 6, pp. 1299–1301, 1997.

Kumer, A. et al., *Applied Physics Letters*, "Features of Gold Having Micrometer to Centimeter Dimensions can be Formed Through a Combination of Stamping with an Elastomeric Stamp and an Alkanethiol "ink" Followed by Chemical Etching", vol. 63, No. 14, pp. 2002–2004, Oct. 4, 1993.

Carey, P.G. et al., *IEEE*, "Poly–Si Thin Film Transistors Fabricated on Plastic Substrate", vol. 1, pp. 126–127, 1998.

Tung, Y. et al., *SID International Symposium Digest of Technical Papers*, "An Ultra–Low–Temperature Poly–Si TFT With Stacked Composite", vol. 29, pp. 889–890, 1998.

Tung, Y. et al., *56$^{th}$ Annual Device Research Conf. Digest*, "A High–Performance Poly–Si TFT Technology Compatible with Flexible Plastic Substrates", pp. 102–103, 1998.

Garnier, et al., *Science*, "All–Polymer Field–Effect Transistor Realized by Printing Techniques", vol. 265, pp. 1684–1686, Sep. 16, 1994.

* cited by examiner

*Primary Examiner*—Matthew Smith
*Assistant Examiner*—Renzo N. Rocchegiani
(74) *Attorney, Agent, or Firm*—Richard J. Botos

(57) ABSTRACT

A process for fabricating an integrated circuit device is disclosed. The integrated circuit has a plurality of TFTs and an electrical interconnect structure. In the process, at least some constituents of the TFTs are formed on a first substrate. At least the interconnect structure is formed on a second substrate. The two substrates are laminated together to form the integrated circuit device having fully formed TFTs.

6 Claims, 1 Drawing Sheet

PROCESS FOR FABRICATING INTEGRATED CIRCUIT DEVICES HAVING THIN FILM TRANSISTORS

BACKGROUND OF THE INVENTION

1. Technical Field

The present invention is directed to a process for fabricating a semiconductor device containing a plurality of thin film transistors (TFT's) and an interconnect structure.

2. Art Background

Thin film transistors (TFTs) are known and are of considerable commercial importance. Amorphous silicon-based thin film transistors are used in active matrix liquid crystal displays. One of the advantages of thin film transistors is that they are susceptible to being made at low cost, both in terms of the materials used and the techniques used to make them.

In addition to making the individual TFTs as inexpensively as possible, it is also desired to form the integrated circuit devices that contain TFTs in an inexpensive manner. This involves not only fabricating the TFT's themselves, but the interconnects for the TFTs that are required to operate the integrated circuit. Accordingly, inexpensive strategies for fabricating integrated circuits with TFTs are sought.

SUMMARY OF THE INVENTION

The present invention is directed to a process for fabricating an integrated circuit having thin film transistors. In the process of the present invention, at least a portion of the TFTs are formed on a first flexible substrate. At least the interconnect structure for the integrated circuit is formed on a second flexible substrate. The two flexible substrates are laminated or otherwise joined together to form the desired semiconductor device. If the entire TFT is not formed on the first substrate (e.g. the TFT gate, gate dielectric and semiconductor are formed on the first substrate but the TFT source and drain are not), the portion of the TFT not formed on the first substrate is formed on a different substrate (e.g. the second substrate on which the interconnect structure is formed). In the embodiments wherein a portion of the TFTs are formed on a first substrate and the remaining portion of the TFTs are formed on a second substrate, the TFTs are assembled by laminating the substrates together.

After the TFTs and the associated interconnect structure are formed, the first substrate is laminated to the second substrate to form the integrated circuit. The process of the present invention is advantageous because it is very versatile. Specifically, the process is economical because the more technically challenging and time consuming aspects of the process (e.g. the formation of the TFT source, drain and gate) can be performed on one substrate and the easier aspects of the process (i.e., the formation of the interconnect structure) is performed on the second substrate. Forming the device on two different substrates provides for a greater choice of process conditions and materials. Also, the process of the present invention allows for parallel processing of portions of the device; a first portion on a first substrate and a second portion on a second substrate. Such parallel processing saves time. For example, if a desirable process step is not compatible with the materials and structures already formed on one substrate, then the process step may be performed on the second substrate. Other attendant advantages of the present invention are readily ascertained by one skilled in the art.

DETAILED DESCRIPTION

In the process of the present invention, a first portion of the integrated circuit device containing TFTs is formed on a first flexible substrate. A second portion of the integrated circuit device is formed on a second flexible substrate. The portion of the integrated circuit device formed on the second flexible substrate is at least the interconnect structure. In the context of the present invention, the interconnect structure is the wiring that electrically interconnects the individual TFTs in the integrated circuit and other devices external to the circuit. Although the present invention is described primarily with reference to a first and second substrate, the use of three or more substrates is contemplated. The use of more substrates provides even greater flexibility as fewer processing steps are required to be performed in any one substrate.

In one embodiment, all of the constituents of the TFTs (e.g. source, drain, semiconductor, gate dielectric and gate) are formed on the first substrate. In a second embodiment, a portion of the TFTs' constituents (e.g. the TFT gate, gate dielectric and semiconductor) are formed on the first substrate and the remaining portion of the TFTs' constituents (e.g. source and drain) are formed on the second substrate.

The substrates used in the present invention are flexible substrates. In the context of the present invention, flexible substrates are substrates that are resilient and not brittle. Consequently, the substrates are not glass or crystalline substrates (e.g. silicon). It is advantageous if the substrates are bendable and can be made very thin (e.g. thicknesses much less than a millimeter). It is also advantageous if the substrates are compatible with reel-to-reel processes. Examples of suitable substrates include plastics such as polyester and polyimide. Plastic substrates are presently used to manufacture flexible circuit boards, are well known to one skilled in the art and are not described in detail herein.

Figure 1:
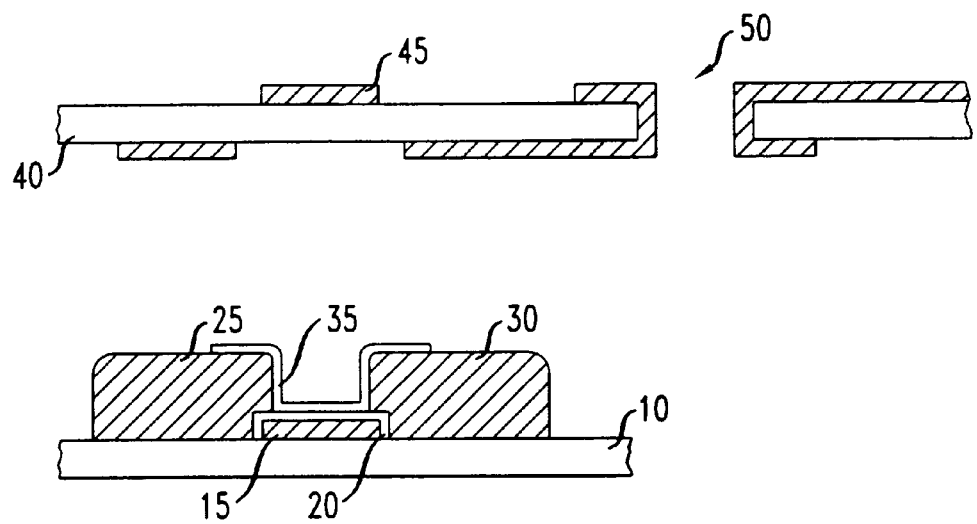
FIG. 1 is a cut-away side view of a thin film transistor formed on a first substrate and an interconnect structure therefore formed on a second substrate.

The formation of TFTs on plastic substrates is conventional and well known to one skilled in the art. One skilled in the art is aware that a variety of materials and process can be used to form such TFTs. Also, a variety of TFT configurations are possible. In one embodiment, the source and drain are formed on the plastic substrate. A semiconductor material is formed over the source and drain and the gate dielectric and gate are formed on top of the semiconductor material. In an alternate embodiment (depicted in FIG. 1), the TFT gate (e.g. a metal or a conducting polymer) 15 is formed on the first substrate 10. A layer of dielectric material 20 is formed over the gate. Source 25 and drain 30 regions are formed over the dielectric material 20. A semiconductor material 35 is deposited between the semiconductor and the source 25 and the drain 30 such that a good ohmic contact is formed between the two electrodes.

The interconnect structure is formed on a second substrate 40. Metal 45 is patterned on both sides of the substrate 40 and through vias 50 in the substrate 40. Conventional techniques are used to deposit and pattern the metal on the substrate.

A variety of materials and expedients are useful for forming the TFTs of the present invention. Organic semiconductor materials are attractive as they are compatible with plastics and can be easily fabricated to provide low-cost, lightweight, and flexible devices with plastic substrates. Organic materials having a conductivity and carrier mobility permitting their use as the active layer in thin-film semiconductor devices are described in U.S. Ser. No.

08/770,535, filed Dec. 20, 1996, "Method of Making An Organic Thin Film Transistor," by Zhenan Bao et al., which is assigned to the present assignee and incorporated herein by reference. An organic device is described in U.S. Ser. No. 09/087,201, filed May 29, 1998, "Thin-Film Transistor Monolithically Integrated With an Organic Light-Emitting Diode," by Zhenan Bao et al., which is assigned to the present assignee and incorporated herein by reference. The '201 application discloses a light emitting diode (LED) having an organic layer as the active layer and a transistor having an organic layer as the semiconductor layer, where the LED and transistor are monolithically integrated.

Inorganic semiconductor materials are also contemplated as suitable for use in the process of the present invention. An example of a suitable inorganic semiconductor material that can be deposited on a plastic substrate is polycrystalline silicon that is deposited as amorphous silicon (via chemical vapor deposition) and converted to polycrystalline silicon via a flash anneal. Other examples of inorganic semiconductors are amorphous silicon, cadmium selenide, cadmium silicide, zinc silicide and tellurium. The semiconductor materials are either n-type or p-type, depending upon the device being formed. For CMOS (Complementary Metal Oxide Semiconductor) devices, both n-type and p-type semiconductor materials are used.

Recently, research related to organic materials in electronic devices has expanded to encompass patterning methods that take advantage of the ease with which these materials may be processed. For example, radiation may be used to pattern photosensitive organic materials, as described in Drury, C. J., et al., "Low-Cost All-Polymer Integrated Circuits," Appl. Phys. Lett. Vol. 73, p. 108 (1998). Non-photolithographic methods provide advantages in terms of cost and flexibility in fabricating semiconductor devices generally. Such techniques include ink jet printing and screen printing which are described in Z. Bao et al., "High Performance Plastic Transistors Fabricated by Printing Techniques," Chem. Mater., Vol. 9, p. 1299 (1997). These techniques are suitable for use in a range of fabrication tasks that provide resolution at about 35 $\mu$m to about 100 $\mu$m and larger.

In order to make devices with features smaller than 35 $\mu$m, higher resolution techniques are required. A technique for imprinting patterns on silicon substrates with features having dimensions of about 10 $\mu$m to about 80 $\mu$m using a planar elastomeric stamp (Kumar, A. et al., "Features of Gold Having Micrometer to Centimeter Dimensions Can Be Formed Through a Combination of Stamping with an Elastomeric Stamp and an Alkanethiol 'Ink' Followed by Chemical Etching," APPL. PHYS. LETT., Vol. 63, p. 2002 (1993)) is also known. The critical dimensions (typically transistor channel lengths) desired for many applications are as low as about 10 $\mu$m. Another fabrication strategy to obtain such high resolution devices has been recently described. This strategy involves a combined micromolding/screen-printing strategy, i.e., this strategy combines an emerging high-resolution technique (micromolding in capillaries) for defining critical features and an established low-resolution method (screen printing) for patterning other elements of the devices. See, e.g., Rogers, J., et al., Nonphotolithographic Fabrication of Organic Transistors With Micron Feature Sizes, Appl. Phys. Lett. Vol. 71, p. 2716 (1998). With this strategy, organic transistors are produced with channel lengths approximately fifty times smaller (about 2 $\mu$m) than those previously achieved with other non-photolithographic schemes, providing a resolution exceeding the requirements for most applications.

The above recitation of techniques used to form organic TFTs is not intended to be exhaustive. Rather, the list of techniques is intended to provide, by way of example, some current known techniques for forming organic TFTs.

The use of organic semiconductor materials has been limited by the lack of compatibility between organic semiconductor materials for TFT devices and the solvents and etchants required to form other elements of the TFT device. For example, the etchant for patterning the metal electrodes is a strong oxidizing medium that is not generally compatible with organic semiconductor materials. However, the present process contemplates parallel processing on separate substrates. To the extent that expedients such as etchants, solvents, etc. that are required to form one element of the device (e.g. the device electrodes) are incompatible with another element of the device (e.g. the organic semiconductor) the contact between the incompatible materials is avoided by judicious division of the processing between the two substrates. Thus, to the extent that the metal etchant used to form the contacts is deleterious to the organic semiconductor, contact between the etchant and the semiconductor is avoided by forming the organic semiconductor on the first substrate. The metal contacts are formed on the second substrate. Thus, the metal etchant used to pattern the metal never contacts the organic semiconductor. Consequently, the process of the present invention relaxes the process constraints on the use of organic semiconductor to form TFTs.

After the TFT devices and the interconnect structure are formed, the first substrate is laminated to the second substrate. The first and second substrates are joined together using either heat, pressure, adhesive or some combination thereof. The use of both conductive and non-conductive adhesives that are commercially available is contemplated. Consequently, a conductive adhesive can be used to connect a conductor with its associated conductor on the second substrate. Similarly, a non-conductive adhesive can be used to bond regions on the first substrate with other regions on the second substrate for mechanical attachment. The manner in which the two substrates are bound together is largely a matter of design choice.

The present invention has been described in terms of an embodiment in which a first substrate with TFTs formed thereon is laminated to a second substrate with the interconnect structure formed thereon. However, numerous other combinations, all of which require laminating at least a first substrate to a second substrate, are contemplated as suitable. Indeed this flexibility in approach is one of the advantages of the present invention.

For example, in one embodiment, the gate, gate dielectric and the semiconductor layer of the TFTs are formed on a first substrate. The interconnects and the source and drain contacts for the TFTs are formed on the second substrate. The two substrates are then laminated together.

In a second embodiment, the gate, gate dielectric and the semiconductor layer of the TFTs are formed on a first substrate. The source and drain contacts for the TFTs are formed on the second substrate. The interconnects are formed on a third substrate. The three substrates are then laminated together.

In a third embodiment, the gate, gate dielectric, semiconductor layer and the source and drain contacts of the TFTs are formed on a first substrate. Interconnects are formed on the second substrate. More interconnects are formed on a third substrate. The three substrates are then laminated together.

In a fourth embodiment, the gate dielectric and semiconductor of the TFT devices are formed on the first substrate. The gates of the TFT devices and some interconnects are formed on a second substrate. The source and drain contacts for the TFT devices and interconnects are formed on a third substrate. The substrates are then laminated together.

In a fifth embodiment, the gate dielectric and the gates of the TFT devices are formed on the first substrate. The semiconductor material and the source and drain contacts are formed on the second substrate. The interconnects are formed on the second substrate. The two substrates are then laminated together.

In a sixth embodiment, the gate dielectric, semiconductor layer and the source and drain contacts of the TFTs are formed on a first substrate. The gates of the TFTs and the interconnects are formed on the second substrate. More interconnects are formed on a third substrate. The three substrates are then laminated together.

In all of the various embodiments described above, it is contemplated that either in the substrate with the interconnect circuitry or in an additional substrate, other electronic devices needed in the final product will be present. Such other devices include passive components such as resistors, inductors, capacitors and antennas commonly used in wireless components. Further examples include arrays of display elements such as light emitting diodes, electrophoretic display elements and polymer dispersed liquid crystal display elements. Other examples include AC electroluminscent devices, ferroelectric liquid crystal devices, and sensor devices. In these integrated final products, the thin-film transistors formed on the first substrate are used to drive the other devices contained in the interconnection substrate or another substrate after all of the substrates are joined together via lamination. If the final product is a sensor (e.g. a transistor with a light sensitive or chemically sensitive material) the substrate and other materials are chosen to facilitate delivery of the stimulus (i.e. the light or chemical).

Figure 2:
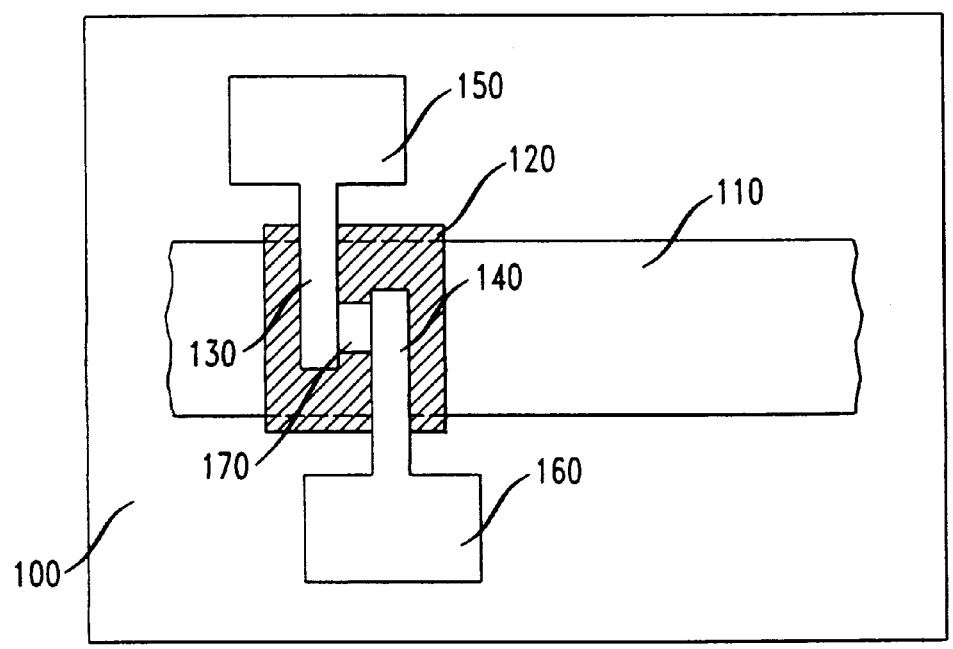
FIG. 2 is a plan view of a laminated thin film transistor formed on a flexible substrate.

In one exemplary embodiment, referring to FIG. 2, a layer of gold (having a thickness of about 100 nm) is deposited on a flexible polyimide substrate. Conventional titanium or chromium glue layers are used to cause the gold to adhere to the substrate. The gold layer 110 is formed using conventional lithography to define a pattern in a layer of photoresist (not shown) formed on the original gold layer. The pattern in the photoresist is transferred to the underlying gold layer using a conventional etch expedient. The patterned gold layer is the gate electrode of the device (a TFT).

A layer of dielectric material 120 (e.g. polyimide, Glass Resin® or benzocyclobutene (i.e. CYCLOTENE®, a trademark of Dow Chemical Co.)) is formed on the patterned gold layer 110 using conventional expedients (e.g. spin-coated or cast from a solution). The thickness of the dielectric layer 120 is about 0.5 $\mu$m. Next the source and drain electrodes, 130 and 140, are formed. The electrodes are, for example, a conductive metal (e.g. gold), conducting polymer (e.g. polyaniline) or a conductive, screen printable ink. Numerous conventional expedients (e.g. screen printing, vacuum evaporation through a shadow mask, conventional blanket metallization followed by photolithography and etching of the metal) are contemplated as suitable for patterning these electrodes. The source and drain electrodes, 130 and 140, are formed with relatively large interconnect pads, 150 and 160. These pads facilitate alignment and interconnection between the source and drain and the interconnect structure on the second substrate. The interconnect substrate will provide the desired interconnection between the discrete device depicted in FIG. 2 and other portions of the final product.

To complete the formation of the device depicted in FIG. 2, a layer of semiconductor material (e.g. dihexyl-α-quinquethiophene) 170 is deposited adjacent to and in contact with the source 130 and the drain 140. The semiconductor and electrode materials are chosen to provide the desired ohmic contact. Electrode materials that provide the desired ohmic contact include carbon-based conductive inks, conductive polymers, gold and gold-coated metals. At this stage, the substrate 100 is laminated to the interconnect substrate.

One advantage of the process of the present invention is that at least a portion of the FETs and the interconnects are designed and fabricated separately, using parallel processing sequences. Fabrication on two or more substrates permits process conditions for each substrate to be optimized separately. For example, forming the thin-film FETs on substrate 100 will require the use of patterning techniques that provide features (e.g. the distance separating the source and drain electrodes) as small as one micron. In contrast the interconnect structure to which the thin-film FET on substrate 100 is connected will have features that are less fine (e.g. on the order of 50 $\mu$m to 250 $\mu$m). Consequently, the expedients selected to fabricate the particular substrate are selected as appropriate. That is, the more expensive and time consuming expedients used to fabricate the features on the first substrate are not used to fabricate the feature on the second substrate.

Yet another advantage derives from the embodiment in which the devices are formed on a first substrate and the interconnect structure on the second substrate. Because the interconnect structure is fabricated separately, an array of the devices on the first substrate can be interconnected in different way (which provides devices with different functionalities).

In another embodiment, the TFT is fabricated by the following process. The first substrate is a MYLAR® (MYLAR is a registered trademark of the E. I. DuPont de Nemours Co.) substrate with conducting strips or lines thereon. The conducting strips are a polymer-based conductor such as carbon-containing ink. The second substrate is also ITO (indium tin oxide) coated Mylar with about 500 nm thick polyimide gate dielectric thereon. Regioregular poly (3-hexylthiophene) is cast from a chloroform solution onto the ITO-coated MYLAR® substrate with the polyimide gate dielectric layer formed thereon. The two substrates are then pressed together. The conducting strips of polymer-based conductor function as the source and drain electrodes and the polyimide is the gate dielectric. The ITO is the gate and the polythiophene is the semiconductor.

In a further example, a first substrate is prepared by forming gate electrodes and gate contacts for TFT devices thereon. A polymeric dielectric material (e.g. polyimide) is applied to selected regions of the substrate. For example, the dielectric is printed over the gate electrodes. An organic semiconductor material is then applied on the substrate using expedients such as solvent casting or evaporation. Examples of suitable organic semiconductors include regioregular poly(hexylthiophene), α, ω-dihexyl-α-sexithiophene and -quinquethiophene, pentacene, copper perfluorophthalocyanine, and N, N'-bis(1H, 1H-pentadecafluorooctyl) napthalene-1,4,5,8-tetracarboxylic diimide. A second substrate is coated with a nickel "glue layer" and a gold film. A hexadecanethiol pattern is defined on the gold, and the metal not covered with thiol is etched with aqueous, oxygenated KOH/KCN (for gold) and $H_2SO_4/H_2O_2/H_3PO_4/NiSO_4$ (for nickel). The remaining metal pattern, including source and drain electrodes, is laminated to the first substrate, completing one or more FETs, and forming associated interconnections The above-described distribution of processing steps between the first substrate and the second substrate permits micron-size channel lengths and the desired top contact geometry (which may include source and drain contact pads that are much larger than the actual source and drain) to be obtained. For example, the reagents used to etch the pattern in the metal on the second substrate would chemically degrade the semiconductor on the first substrate. By dividing the processing between two substrates, the reagents can be used yet contact between the reagents and the semiconductors are avoided. Furthermore, metals such as gold do not adhere well to fluorinated organic semiconductors. Again, by dividing the processing between two substrates, delamination problems, such as the one noted above, are avoided.

In yet another example, the gate, dielectric material and semiconductor are formed on one substrate and conductive carbon patterns are formed on the second substrate. The two substrates are laminated together to form a working device.

The previous description is provided to illustrate particular examples of the claimed invention. These examples are not intended to limit the invention. One skilled in the art will appreciate that a wide variety of processing solutions are within the scope of the present invention, in addition to the specific examples provided herein.

What is claimed is:

1. A process for integrated circuit device fabrication comprising:

forming at least a portion of a thin film transistor on a first flexible substrate;

forming an interconnect structure on a second flexible substrate;

laminating the first flexible substrate to the second flexible substrate, thereby electrically interconnecting the thin film transistor with the interconnect structure.

2. The process of claim 1 wherein the thin film transistor comprises a gate, a gate dielectric, a semiconductor, a source and a drain.

3. The process of claim 2 wherein the entire thin film transistor is formed on the first substrate.

4. The process of claim 2 wherein the gate, gate dielectric and semiconductor of the thin film device are formed on the first substrate and the source and drain of the thin film device are formed on the second substrate.

5. The process of claim 4 wherein the semiconductor is an organic semiconductor.

6. The process of claim 4 wherein the semiconductor is an inorganic semiconductor.

* * * * *